(12) United States Patent
Chou et al.

(10) Patent No.: US 9,362,271 B2
(45) Date of Patent: Jun. 7, 2016

(54) CAPACITIVE DEVICE

(71) Applicant: TAIWAN SEMICONDUCTOR MANUFACTURING COMPANY, LTD., Hsinchu (TW)

(72) Inventors: Chung-Yen Chou, Hsinchu (TW); Po-Ken Lin, Hsinchu (TW); Chia-Shiung Tsai, Hsinchu (TW); Ru-Liang Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/822,343

(22) Filed: Aug. 10, 2015

(65) Prior Publication Data

US 2015/0348964 A1    Dec. 3, 2015

Related U.S. Application Data

(63) Continuation of application No. 14/091,657, filed on Nov. 27, 2013, now Pat. No. 9,105,759.

(51) Int. Cl.
| | |
|---|---|
| *H01L 29/00* | (2006.01) |
| *H01L 21/8242* | (2006.01) |
| *H01L 27/08* | (2006.01) |
| *H01L 49/02* | (2006.01) |

(52) U.S. Cl.
CPC ............ *H01L 27/0805* (2013.01); *H01L 28/60* (2013.01); *H01L 28/91* (2013.01); *H01L 28/92* (2013.01)

(58) Field of Classification Search
CPC ...... H01L 27/0805; H01L 28/91; H01L 28/92
USPC .................................................. 257/243, 534
See application file for complete search history.

(56) References Cited

U.S. PATENT DOCUMENTS

| | | |
|---|---|---|
| 2013/0161792 A1 | 6/2013 | Tran et al. |
| 2013/0181326 A1 | 7/2013 | Cheng et al. |
| 2014/0145299 A1 | 5/2014 | Kalnitsky et al. |
| 2015/0061069 A1 | 3/2015 | Friedrich et al. |
| 2015/0076657 A1 | 3/2015 | Chou et al. |

*Primary Examiner* — David S Blum
(74) *Attorney, Agent, or Firm* — Hauptman Ham, LLP

(57) ABSTRACT

A capacitive device includes a substrate, a well structure buried in the substrate, a first stacked layer that includes a first dielectric layer and a first conductive layer, a cap dielectric layer, and a first electrode. The well has a predetermined doping type. The well includes a first shoulder portion having an upper surface, a second shoulder portion having an upper surface, and a first trench between the first and second shoulder portions. The first trench has sidewalls and a bottom surface. The first dielectric layer is lined along at least a portion of the upper surfaces of the first and second shoulder portions, the sidewalls of the first trench, and the bottom surface of the first trench. The first conductive layer is lined along the first dielectric layer. The cap dielectric layer is over the well, the first dielectric layer, and the first conductive layer. The first electrode is in contact with the first shoulder portion and extends through the cap dielectric layer, the first conductive layer, and the first dielectric layer.

20 Claims, 12 Drawing Sheets

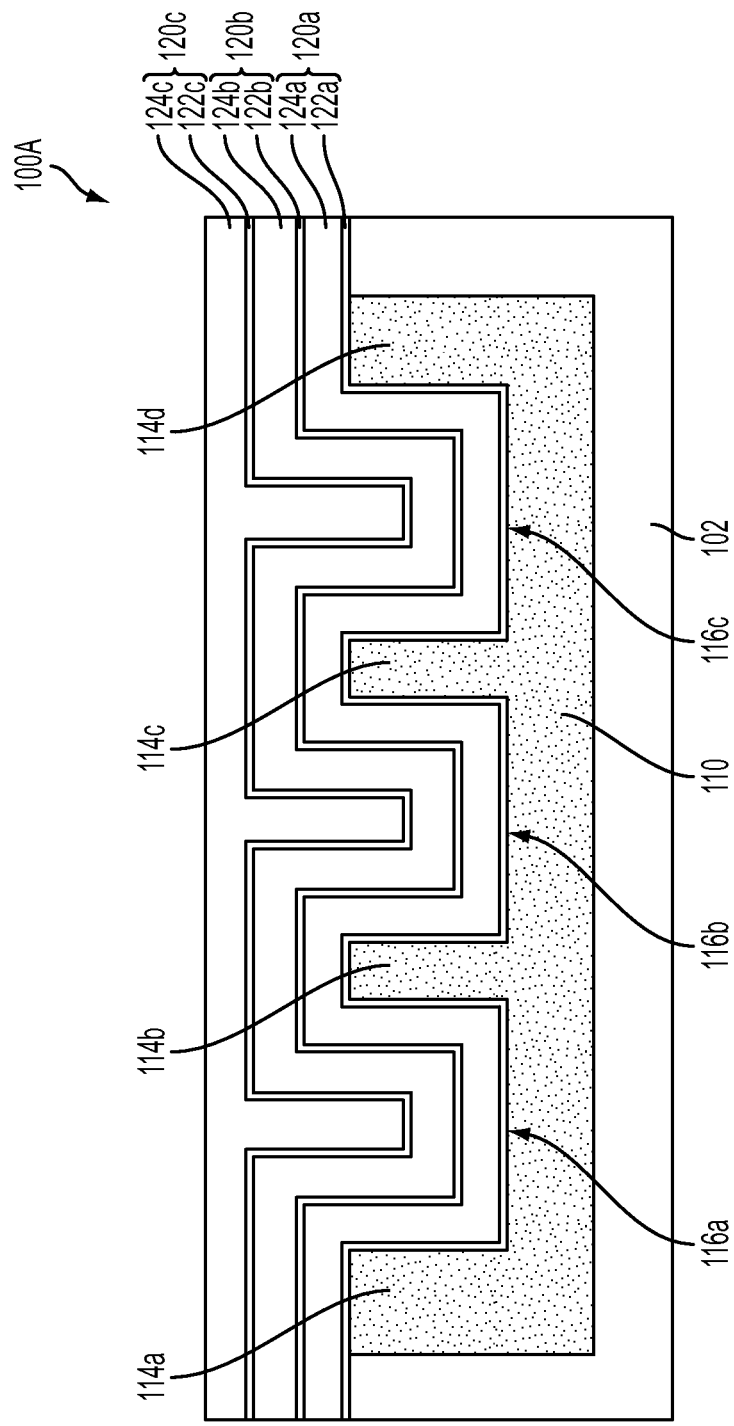

CAPACITIVE DEVICE

PRIORITY CLAIM

The present application is a continuation of U.S. application Ser. No. 14/091,657, now U.S. Pat. No. 9,105,759, filed Nov. 27, 2013, which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. In the course of integrated circuit evolution, functional density (i.e., the number of interconnected devices per chip area) has generally increased while geometry size (i.e., the smallest component or line that can be created using a fabrication process) has decreased. While existing semiconductor capacitive devices have been generally adequate for their intended purposes, they have not been entirely satisfactory in every aspect. Therefore, along with the development of IC technology, various new capacitive devices are also being developed.

DESCRIPTION OF THE DRAWINGS

One or more embodiments are illustrated by way of example, and not by limitation, in the figures of the accompanying drawings, wherein elements having the same reference numeral designations represent like elements throughout.

FIGS. 4A-4I are cross-sectional views of a capacitive device at various stages of production in accordance with one or more embodiments.

DETAILED DESCRIPTION

Figure 1A:
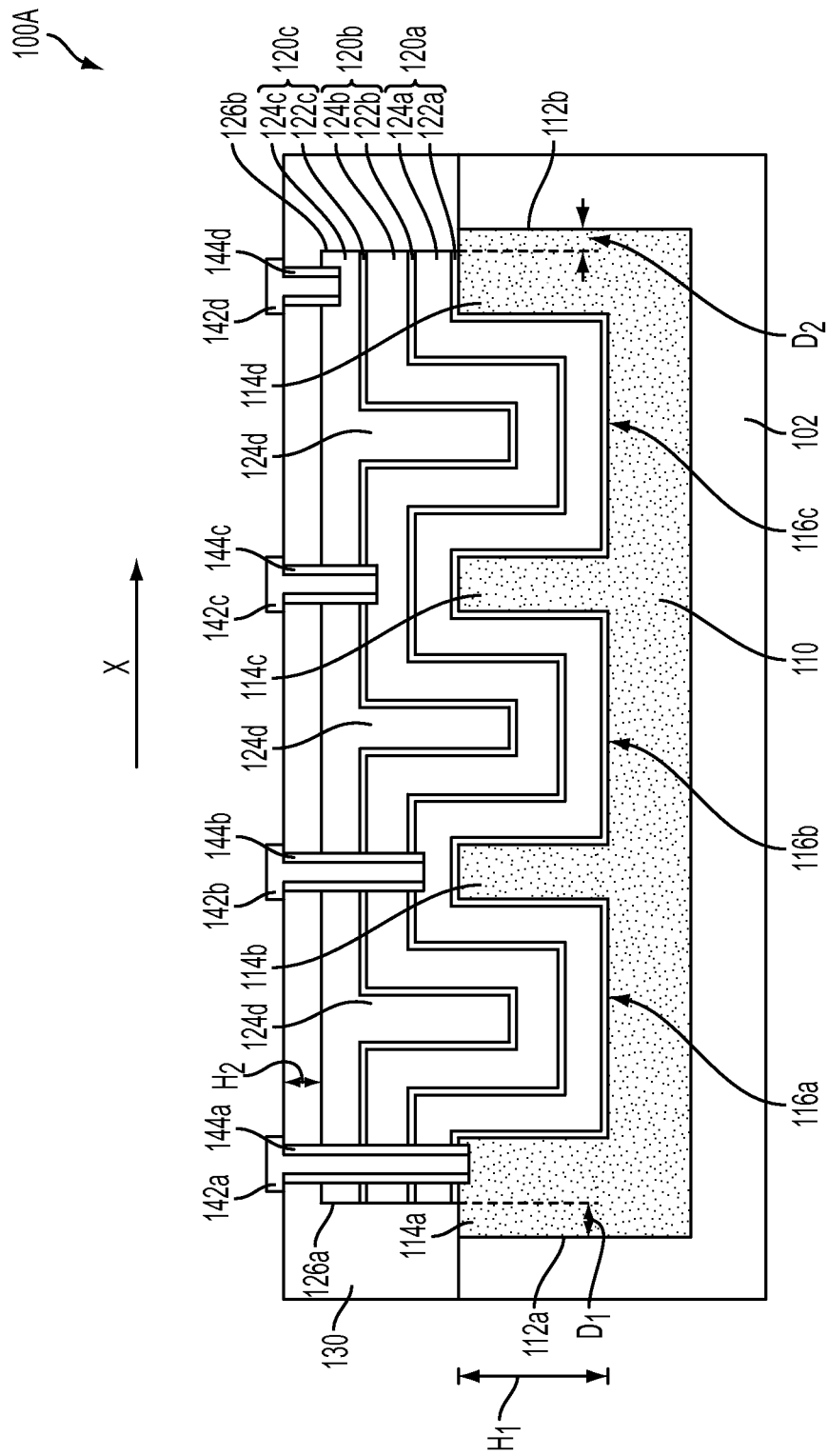
FIG. 1A is a cross-sectional view of a capacitive device in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one feature relationship to another feature. The spatially relative terms are intended to cover different orientations of the device including the features.

FIG. 1A is a cross-sectional view of a capacitive device 100A in accordance with one or more embodiments. Only capacitive device 100A is depicted in FIG. 1A. One or more other electrical components that belong to the same integrated circuit as the capacitive device 100A are omitted.

Capacitive device 100A includes a substrate 102, a well 110 buried in substrate 102, three sets of stacked layers 120a, 120b, and 120c over well 110, a cap dielectric layer 130 covering stacked layers 120a-120c, four electrodes 142a, 142b, 142c, and 142d, and four isolation structures 144a, 144b, 144c, and 144d surrounding corresponding electrodes 142a, 142b, 142c, and 142d.

In some embodiments, substrate 102 includes: an elementary semiconductor such as silicon or germanium in crystal, polycrystalline, or an amorphous structure; a compound semiconductor including silicon carbide, gallium arsenide, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. In at least one embodiment, substrate 102 is an alloy semiconductor substrate having a gradient SiGe feature in which the Si and Ge composition change from one ratio at one location to another ratio at another location of the gradient SiGe feature. In another embodiment, the alloy SiGe is formed over a silicon substrate. In yet another embodiment, a SiGe substrate is strained. In some further embodiments, substrate 102 is a semiconductor on insulator. In some examples, substrate 102 includes an epitaxial layer or a buried layer. In other examples, substrate 102 includes a multilayer compound semiconductor structure.

In some embodiments, substrate 102 generally exhibits a conductive characteristic similar to that of an intrinsic semiconductor material or a semiconductor material having a first predetermined doping type. In some embodiments, the first predetermined doping type is a P-type doping.

Well 110 is buried in substrate 102 and bounded by end walls 112a and 112b along a trench width direction X. In some embodiments, well 110 has a second predetermined doping type that is opposite that of the substrate. In some embodiments, the second predetermined doping type is an N-type doping. In some embodiments, well 110 has a material substantially the same as substrate 102, except for the difference in their conductive characteristics or doping types.

Well 110 has four shoulder portions 114a, 114b, 114c, and 114d and three trenches 116a, 116b, and 116c. Trench 116a is sandwiched between shoulder portions 114a and 114b. Trench 116b is sandwiched between shoulder portions 114b and 114c. Trench 116c is sandwiched between shoulder portions 114c and 114d. In some embodiments, well 110 has M shoulder portions, and M is a positive integer equal to or greater than 2. Each of the M shoulder portions has an upper surface. In some embodiments, well 110 has (M−1) trenches, an m-th trench of the (M−1) trenches is sandwiched between an m-th shoulder portion and an (m+1)-th shoulder portion of the M shoulder portions. Order index m is a positive integer from 1 to (M−1), and the order is viewed along direction X, i.e., from left to the right on the page. The m-th trench of the (M−1) trenches has sidewalls and a bottom surface. In some embodiments, M equals 2, and well 110 has one trench sandwiched by two corresponding shoulder portions.

Trenches 116a, 116b, and 116c are configured to be sufficiently wide to accommodate stacked layers 120a, 120b, and 120c. In some embodiments, if there are N sets of stacked layers (N is a positive integer) between well 110 and cap dielectric layer 130, the conductive layers of the N sets of stacked layers each has a thickness equal to or greater than Ta, the dielectric layers of the N sets of stacked layers each has a thickness equal to or greater than Tb, the (M−1) trenches each has a width equal to or greater than (2·N·(Ta+Tb)−Tb). In some embodiments, the (M−1) trenches, such as trenches 116a, 116b, and 116c, have the same width.

In some embodiments, depth H1 of one or more of trenches 116a, 116b, and 116c ranges from 20 micron (μm) to 100 μm. A total capacitance value of capacitive device 100A is a function of depth H1 of trenches 116a, 116b, or 116c. In some embodiments, a deeper trench results in a greater capacitance value of the capacitive device 100A. In some embodiments, depth H1 of the trenches is confined by limitations regarding spatial resolutions and aspect ratios of a particular manufacturing process used to make capacitive device 100A.

The three sets of stacked layers 120a, 120b, and 120c collectively have end walls 126a and 126b. The portion of the three sets of stacked layers 120a, 120b, and 120c over shoulder portion 114a only covers a portion of the upper surface of shoulder portion 114a, and a distance D1 between end wall 126a and end wall 112a of well 110 ranges from 0.2 μm to 1 μm. The portion of the three sets of stacked layers 120a, 120b, and 120c over shoulder portion 114d only covers a portion of the upper surface of shoulder portion 114d, and a distance D2 between end wall 126b and end wall 112c of well 110 ranges from 0.2 μm to 1 μm.

A first set of stacked layers 120a includes a dielectric layer 122a and a conductive layer 124a over dielectric layer 122a. Dielectric layer 122a is lined along at least a portion of upper surfaces of shoulder portions 114a-114d, the sidewalls of trenches 116a-116c, and the bottom surface of trenches 116a-116c. Conductive layer 124a is lined along dielectric layer 122a.

Furthermore, a second set of stacked layers 120b includes a dielectric layer 122b and a conductive layer 124b over dielectric layer 122b. Dielectric layer 122b is lined along conductive layer 124a, and conductive layer 124b is lined along dielectric layer 122b. A third set of stacked layers 120c includes a dielectric layer 122c and a conductive layer 124c over dielectric layer 122c. Dielectric layer 122c is lined along conductive layer 124b, and conductive layer 124c is lined along dielectric layer 122c.

In some embodiments, capacitive device 100A has more or less than three sets of stacked layers as depicted in FIG. 1A. In some embodiments, capacitive device 100A has N sets of stacked layers lined along the upper surfaces of the M shoulder portions, the sidewalls of the (M−1) trenches, and the bottom surfaces of the (M−1) trenches. In some embodiments, each set of the N sets of stacked layers has a dielectric layer and a conductive layer over the dielectric layer. In some embodiments, N is a positive integer and is equal to or greater than three (3).

In some embodiments, each of the dielectric layers of the N sets of stacked layers, such as dielectric layers 122a-122c, has a multilayer structure. In some embodiments, one of the dielectric layers 122a-122c has a lower silicon oxide layer, a silicon nitride layer over the lower silicon oxide layer, and an upper silicon oxide layer. In some embodiments, the conductive layers of the N sets of stacked layers, such as conductive layers 124a-124c, have a material including polysilicon.

In some embodiments, each of conductive layers 124a, 124b, and 124c has a thickness ranging from 500 angstroms (Å) to 1 μm. In some embodiments, each of dielectric layers 122a, 122b, and 122c has a thickness ranging from 40 Å to 600 Å. In FIG. 1, middle portion 124d of conductive layer 124c has an T-shape in the trenches 11a-116c of well 110 rather than a U-shape like conductive layers 124a and 124b. In some embodiments, middle portion 124d of conductive layer 124c has a thickness, measurable along trench width direction X, ranging from 0.8 to 2.2 times that of the horizontal portion of conductive layer 124c. In some embodiments, middle portion 124d of conductive layer 124c has a thickness of about the same as that of the horizontal portion of conductive layer 124c.

Cap dielectric layer 130 is disposed over the substrate 102, the well 110, and the three sets of stacked layers 120a-120c. Cap dielectric layer 130 is configured to have a height sufficient to cover the three sets of stacked layers 120a-120c. In FIG. 1, an upper surface of cap dielectric layer 130 is higher than an upper surface of the three sets of stacked layers 120a-120c by a height H2. In some embodiments, height H2 ranges from 0.3 μm to 1 μm. In some embodiments, cap dielectric layer 130 includes silicon oxide or high-dielectric constant (high-k) dielectric materials.

The four electrodes 142a-142d are arranged to be in contact with well 110 or conductive layers 124a-124c of the three sets of stacked layers 120a-120c. In FIG. 1, electrode 142a is in contact with shoulder portion 114a of well 110 and extends through cap dielectric layer 130, conductive layers 124c, 124b, and 124a, and dielectric layers 122c, 122b, and 122a. Electrode 142b is in contact with conductive layer 124a directly over shoulder portion 114b and extends through cap dielectric layer 130, conductive layers 124c and 124b, and dielectric layers 122c and 122b. Electrode 142c is in contact with conductive layer 124b directly over shoulder portion 114c of well 110 and extends through cap dielectric layer 130, conductive layer 124c, and dielectric layer 122c. Electrode 142d is in contact with conductive layer 124c directly over shoulder portion 114d of well 110 and extends through cap dielectric layer 130.

In some embodiments, each of electrodes 142a, 142b, 142c, and 142d is arranged to be directly on or above any of the shoulder portions 114a, 114b, 114c, and 114d. In some embodiments, electrodes 142a, 142b, 142c, and 142d are arranged to be directly on or above only one of the shoulder portions 114a, 114b, 114c, and 114d. Also, as illustrated above, in some embodiments, there are more or less than four shoulder portions. In some embodiments, there are more or less than four electrodes arranged directly over one or more shoulder portions.

Isolation structures 144a, 144b, 144c, and 144d are configured to isolate sidewalls of corresponding electrodes 142a, 142b, 142c, and 142d from being unintentionally, electrically coupled with well 110 or conductive layers 124a, 124b, and 124c of the three sets of stacked layers 120a, 120b, and 120c.

Well 110 and conductive layers 124a, 124b, and 124c of the three sets of stacked layers 120a, 120b, and 120c are configured to function as a capacitor, which includes a first terminal and a second terminal. For example, well 110 and conductive layer 124b are arranged as the first terminal of the capacitor, and conductive layers 124a and 124c are arranged as the second terminal of the capacitor. Therefore, electrodes 142a and 142c are associated with the first terminal of the capacitor, and electrodes 142b and 142d are associated with the second terminal of the capacitor.

Capacitive device 100A is just an example configuration of various factors including numbers of stacked layers, shoulder portions, trenches, or electrodes. In some embodiments, there are other different layouts for making capacitive device 100A.

Figure 1B:
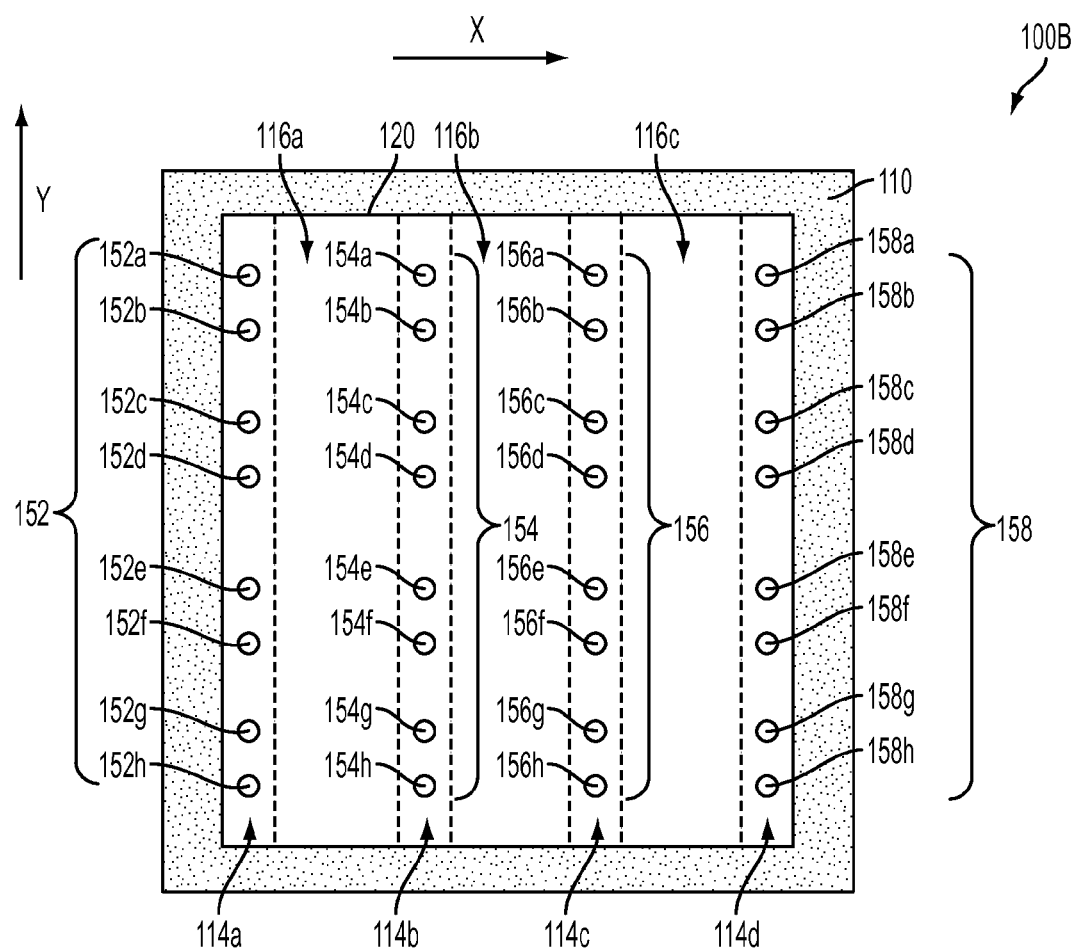
FIG. 1B is a top view of a capacitive device in accordance with one or more embodiments.

FIG. 1B is a top view of a capacitive device 100B in accordance with one or more embodiments. In some embodiments, a cross-sectional view of capacitive device 100B demonstrates a structure similar to that of capacitive device 100A in FIG. 1A. Components of capacitive device 100B similar to those of capacitive device 100A are given the same reference numerals, and thus some descriptions are repeated.

Capacitive device 100B has well 110 and N sets of stacked layers, such as stacked layers 120a, 120b, and 120c in FIG. 1A (collectively referred to as N sets of stacked layers 120) over shoulder portions 114a, 114b, 114c, and trenches 116a, 116b, and 116c. Capacitive device 100B further includes four sets of electrodes 152, 154, 156, and 158 variously in contact with one or more of well 110 or conductive layers of the N sets of stacked layers 120.

The set of electrodes 152 includes electrodes 152a-152h aligned along a trench length direction Y and directly on or above shoulder portion 114a. The set of electrodes 154 includes electrodes 154a-154h aligned along the trench length direction Y and directly on or above shoulder portion 114b. The set of electrodes 156 includes electrodes 156a-156h aligned along the trench length direction Y and directly on or above shoulder portion 114c. The set of electrodes 158 includes electrodes 158a-154h aligned along the trench length direction Y and directly on or above shoulder portion 114d.

Moreover, each group (i.e., row) of electrodes 152a, 154a, 156a, and 158a, electrodes 152b, 154b, 156b, and 158b, electrodes 152c, 154c, 156c, and 158c, electrodes 152d, 154d, 156d, and 158d, electrodes 152e, 154e, 156e, and 158e, electrodes 152f, 154f, 156f, and 158f, electrodes 152g, 154g, 156g, and 158g, and electrodes 152h, 154h, 156h, and 158h is aligned along a trench width direction X.

In some embodiments, N sets of stacked layers 120 and well 110 are configured to function as a capacitor having a first terminal and a second terminal. In some embodiments, electrodes 152a, 154a, 156a, 158a, 152b, 154b, 156b, and 158b are coupled with well 110 or conductive layers of stacked layers 120 that are associated with the first terminal of the capacitor; and electrodes 152c, 154c, 156c, 158c, 152d, 154d, 156d, and 158d with well 110 or conductive layers of stacked layers 120 that are associated with the second terminal of the capacitor. In some embodiments, electrodes 152e, 154e, 156e, 158e, 152f, 154f, 156f, and 158f are coupled with well 110 or conductive layers of stacked layers 120 that are associated with the first terminal of the capacitor; and electrodes 152g, 154g, 156g, 158g, 152h, 154h, 156h, and 158h are coupled with well 110 or conductive layers of stacked layers 120 that are associated with the second terminal of the capacitor.

In some embodiments, two or more rows of electrodes associated with the same terminal of the capacitive device are also arranged to be closer to one another than another row associated with a different terminal of the capacitive device. For example, a distance between a row of electrodes 152a, 154a, 156a, and 158a and a row of electrodes 152b, 154b, 156b, and 158b measurable along the trench length direction Y is less than that between a row of electrodes 152c, 154c, 156c, and 158c and the row of electrodes 152a, 154a, 156a, and 158a and less than that between the row of electrodes 152c, 154c, 156c, and 158c and the row of electrodes 152b, 154b, 156b, and 158b. In another example, a distance between a row of electrodes 152c, 154c, 156c, and 158c and a row of electrodes 152d, 154d, 156d, and 158d measurable along the trench length direction Y is less than that between the row of electrodes 152b, 154b, 156b, and 158b and the row of electrodes 152c, 154c, 156c, and 158c and less than that between the row of electrodes 152b, 154b, 156b, and 158b and the row of electrodes 152d, 154d, 156d, and 158d.

In some embodiments, a first conductive path extending along the trench width direction X above and between the row of electrodes 152a, 154a, 156a, and 158a and the row electrodes 152b, 154b, 156b, and 158b in order to electrically connected these two rows of electrodes associated with the first terminal of the capacitive device. In some embodiments, a second conductive path extending along the trench width direction X above and between the row of electrodes 152c, 154c, 156c, and 158c and the row electrodes 152d, 154d, 156d, and 158d in order to electrically connected these two rows of electrodes associated with the second terminal of the capacitive device. In some embodiments, a conductive path extending along the trench width direction X above and between the row of electrodes 152e, 154e, 156e, and 158e and the row electrodes 152f, 154f, 156f, and 158f in order to electrically connected these two rows of electrodes associated with the first terminal of the capacitive device. In some embodiments, a conductive path extending along the trench width direction X above and between the row of electrodes 152g, 154g, 156g, and 158g and the row electrodes 152h, 154h, 156h, and 158h in order to electrically connected these two rows of electrodes associated with the second terminal of the capacitive device.

Four sets (i.e., columns) of electrodes are depicted in FIG. 1B. In some embodiments, there are more or less than four columns of electrodes in a capacitive device. Also, eight rows of electrodes are depicted in FIG. 1B. In some embodiments, there are more or less than eight rows of electrodes in a capacitive device.

Capacitive device 100B is just an example layout of shoulder portions, trenches, or electrodes, are configured. In some embodiments, there are other different layouts for making capacitive device 100A or capacitive device 100B.

Figure 2:
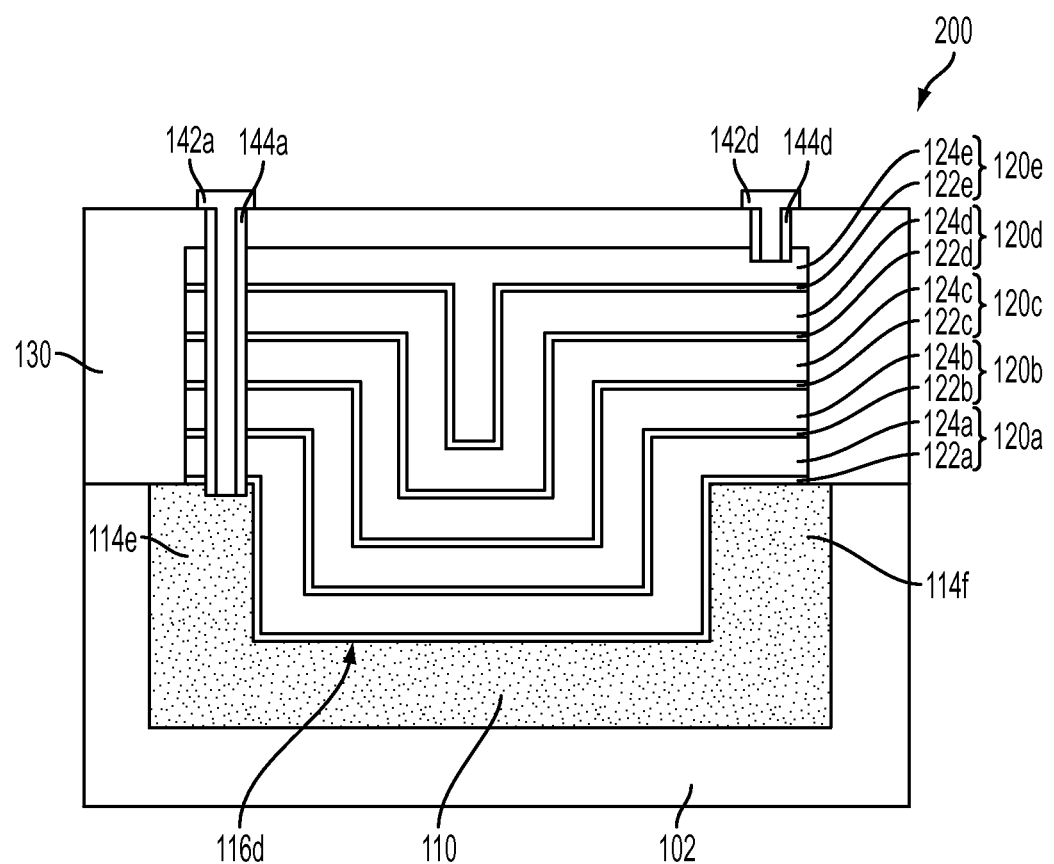
FIG. 2 is a cross-sectional view of another capacitive device in accordance with one or more embodiments.

FIG. 2 is a cross-sectional view of another capacitive device 200 in accordance with one or more embodiments. Components of capacitive device 200 similar to those of capacitive device 100A are given the same reference numerals, and thus some descriptions are repeated.

Compared with capacitive device 100A, capacitive device 200 has one trench 116d and two shoulder portions 114e and 114f in well 110 and five sets of stacked layers 120a-120e lined over trench 116d and shoulder portions 114e and 114f. The set of stacked layers 120d has a dielectric layer 122d over conductive layer 124c and a conductive layer 124d over dielectric layer 122d. The set of stacked layers 120e has a dielectric layer 122e over conductive layer 124d and a conductive layer 124e over dielectric layer 122e. Electrode 142a, surrounded by isolation structure 144a, is in contact with well 110, and electrode 142d, surrounded by isolation structure 144d, is in contact with conductive layer 124e. In some embodiments, other electrodes coupled with various conductive layers 124a-124e or well 110 are variously formed on or above shoulder portions 114e or 114f and aligned along a trench length direction (direction Y in FIG. 1B or a direction entering the page in FIG. 2).

Capacitive device 200, in conjunction with capacitive device 100A and capacitive device 100B, are examples showing how various factors, such as numbers of stacked layers, shoulder portions, trenches, or electrodes, are adjusted to come up with different configuration of a capacitive device. In some embodiments, there are other configurations different than those of capacitive device 100A, capacitive device 100B, or capacitive device 200.

Figure 3:
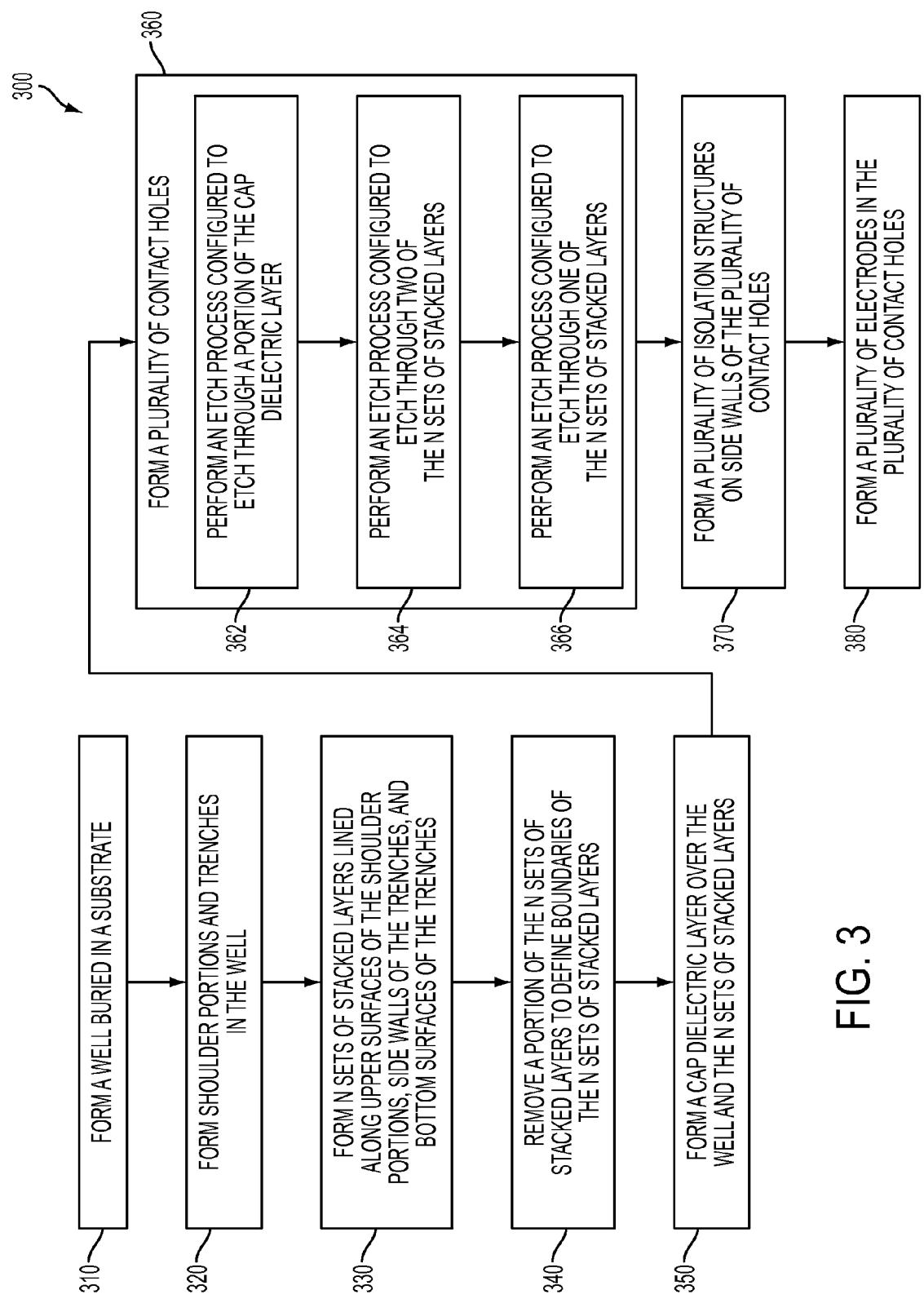
FIG. 3 is a flow chart of a method of manufacturing a capacitive device in accordance with one or more embodiments.

FIG. 3 is a flow chart of a method 300 of manufacturing a capacitive device, such as capacitive device 100A, in accordance with one or more embodiments. FIGS. 4A-4I are cross-sectional views of a capacitive device, using capacitive device 100A as an example, at various stages of production in accordance with one or more embodiments. It is understood that additional operations may be performed before, during, and/or after the method 300 depicted in FIG. 3, and that some other processes may only be briefly described herein.

Method 300 begins with operation 310, in which a well is formed in a substrate. In some embodiments, the well is buried in substrate. In some embodiments, the substrate generally exhibits a conductive characteristic of an intrinsic semiconductor material or a semiconductor material having a first predetermined doping type. In some embodiments, the first predetermined doping type is a P-type doping. In some embodiments, the well has a second predetermined doping type that is opposite that of the substrate. In some embodiments, the second predetermined doping type is an N-type doping.

In some embodiments, the well is formed by performing an ion implantation process to implant N-type dopants into a predetermined region of the substrate. In some embodiments, the well is formed by first removing a portion of the substrate to form a recess and then depositing and/or epitaxially growing the well in the recess.

Figure 4A:
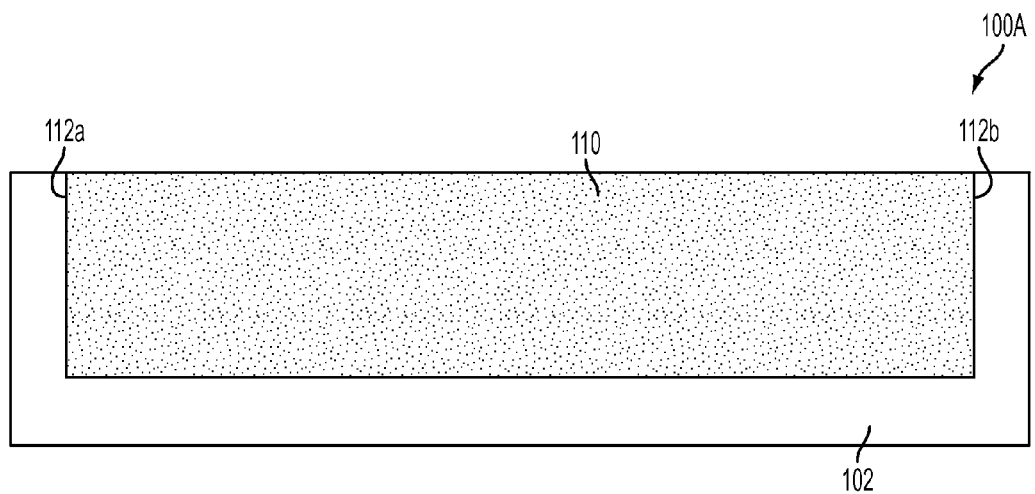

FIG. 4A is a cross-sectional view of a capacitive device 100A following operation 310 in accordance with one or more embodiments. Capacitive device 100A includes well 110 buried in substrate 102 between end walls 112a and 112b. In some embodiments, Returning to FIG. 3, in operation 320, an etch process is performed on the well of the resulting structure as depicted in FIG. 4A in order to form M shoulder portions and (M−1) trenches in the well. M is a positive integer equal to or greater than 2. In some embodiments, an m-th trench of the (M−1) trenches being sandwiched between an m-th shoulder portion and an (m+1)-th shoulder portion of the M shoulder portions, and m is a positive integer from 1 to (M−1). In some embodiments, operation 320 includes performing a dry etch process.

Figure 4B:
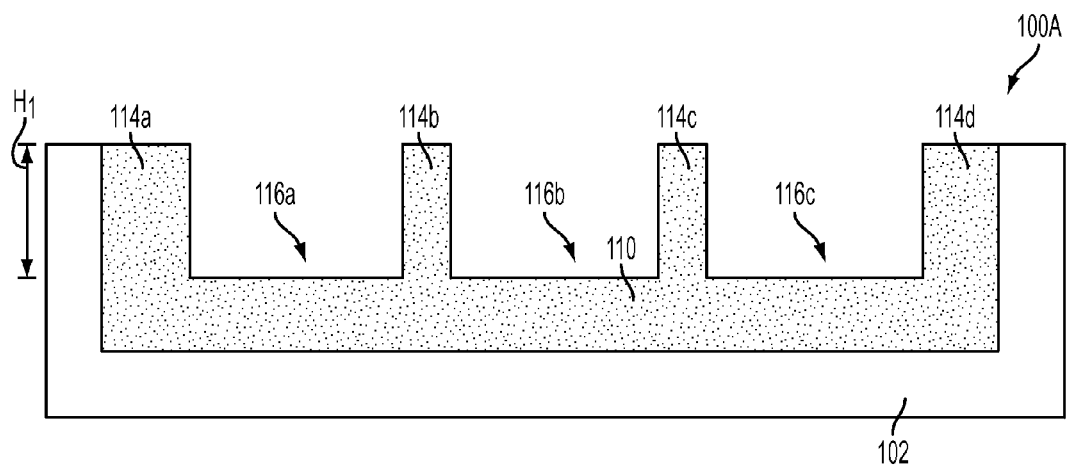

FIG. 4B is a cross-sectional view of a capacitive device 100A following operation 320 in accordance with one or more embodiments. In FIG. 4B, M is set to be three (3). In some embodiments, M is set to be more or less than three. In at least one embodiment, M is set to be five (5). Well 110 of capacitive device 100A has trenches 116a-116c and shoulder portions 114a-114d. One or more of trenches 116a-116c has a depth H1 ranging from 20 μm to 100 A μm.

Returning to FIG. 3, in operation 330, N sets of stacked layers are lined along upper surfaces of the M shoulder portions, sidewalls of the (M−1) trenches, and bottom surfaces of the (M−1) trenches. N is a positive integer. Each set of the N sets of stacked layers includes a dielectric layer and a conductive layer over the dielectric layer.

In some embodiments, formation of each dielectric layer of the N sets of stacked layers includes forming a silicon oxide layer by performing a Chemical Vapor Deposition (CVD) process, such as a Low-Pressure Chemical Vapor Deposition (LPCVD) process, or a thermal process. In some embodiments, formation of each dielectric layer of the N sets of stacked layers includes forming a silicon nitride layer by performing an LPCVD process. In some embodiments, each dielectric layer of the N sets of stacked layers has a thickness ranging from 40 Å to 600 Å.

In some embodiments, at least one of the dielectric layer of the N sets of stacked layers is formed by forming a lower silicon oxide layer by performing an LPCVD process or a thermal process, forming a silicon nitride layer over the lower silicon oxide layer by performing another LPCVD process, and forming an upper silicon oxide layer over the silicon nitride layer by performing an LPCVD process or a thermal process. In some embodiments, the silicon nitride layer has a thickness greater than those of the lower silicon oxide layer and upper silicon oxide layer. In some embodiments, each dielectric layer of the N sets of stacked layers has a thickness ranging from 40 Å to 600 Å.

In some embodiments, formation of each conductive layer of the N sets of stacked layers includes forming a polysilicon layer by performing a CVD process, such as an LPCVD process. In some embodiments, each conductive layer of the N sets of stacked layers has a thickness ranging from 500 Å to 1 μm.

FIG. 4C is a cross-sectional view of a capacitive device 100A following operation 330 in accordance with one or more embodiments. In FIG. 4C, N is set to be three (3), and capacitive device 100A thus has three sets of stacked layers 120a, 120b, and 120c lined over trenches 116a-116c and shoulder portions 114a-114d of well 110. Stacked layers 120a, 120b, and 120c include corresponding dielectric layers 122a-122c and corresponding conductive layers 124a-124c.

Returning to FIG. 3, in operation 340, end portions of the N sets of stacked layers are trimmed to define boundaries of the N sets of stacked layers. In some embodiments, operation 340 includes performing a dry etch process. In some embodiments, a distance between an end wall of the N sets of stacked layers and an adjacent end wall of well ranges from 0.2 μm to 1 μm.

Figure 4D:
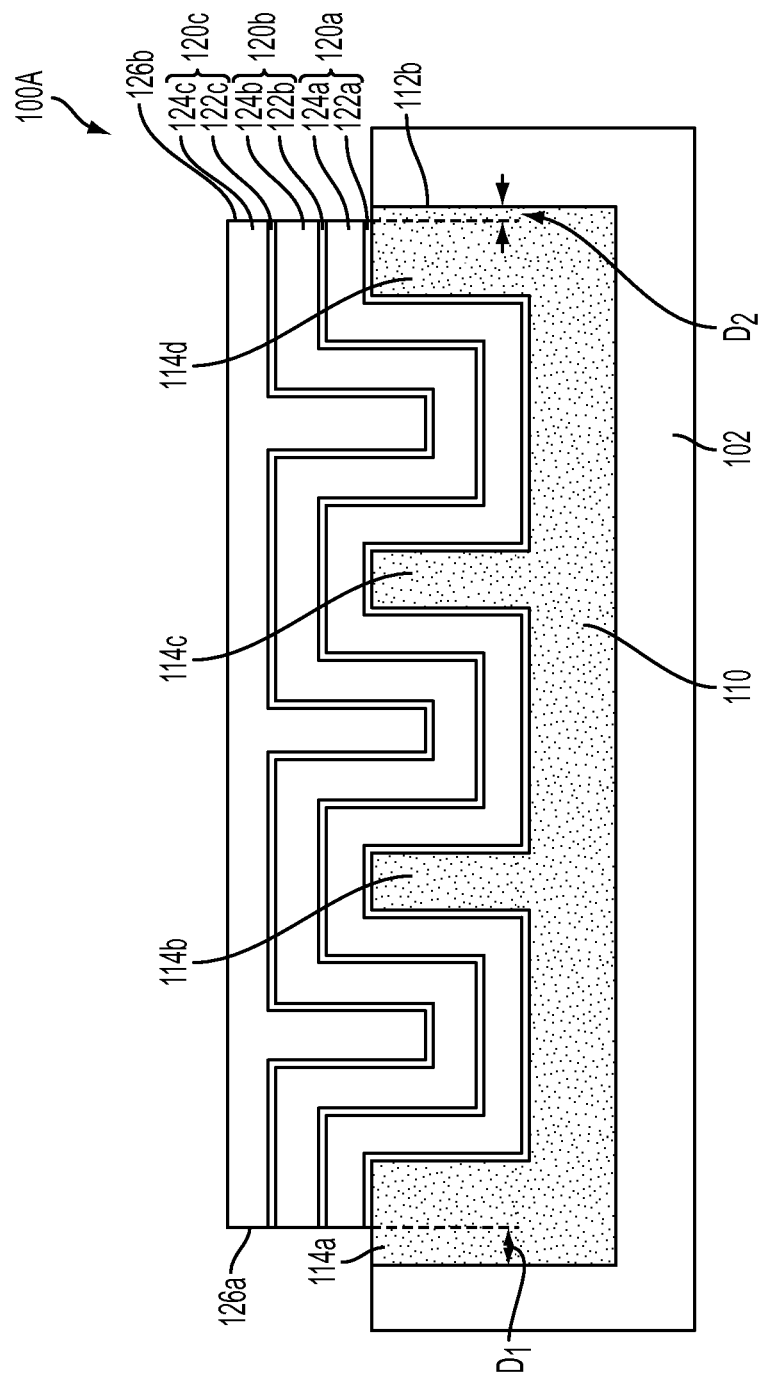

FIG. 4D is a cross-sectional view of a capacitive device 100A following operation 340 in accordance with one or more embodiments. In FIG. 4D, stacked layers 120a, 120b, and 120c are shaped to have end walls 126a and 126b. In some embodiments, a distance D1 between end wall 126a and end wall 112a of well 110 ranges from 0.2 μm to 1 μm. In some embodiments, a distance D2 between end wall 126b and end wall 112c of well 110 ranges from 0.2 μm to 1 μm.

Returning to FIG. 3, in operation 350, a cap dielectric layer is formed over the well and the N sets of stacked layers. In some embodiments, the cap dielectric layer includes silicon oxide or high-k dielectric materials. In some embodiments, the cap dielectric layer is formed by performing a CVD process. In some embodiments, the cap dielectric layer is configured to have a height above an upper surface of the N sets of stacked layers by 0.3 μm to 1 μm.

Figure 4E:
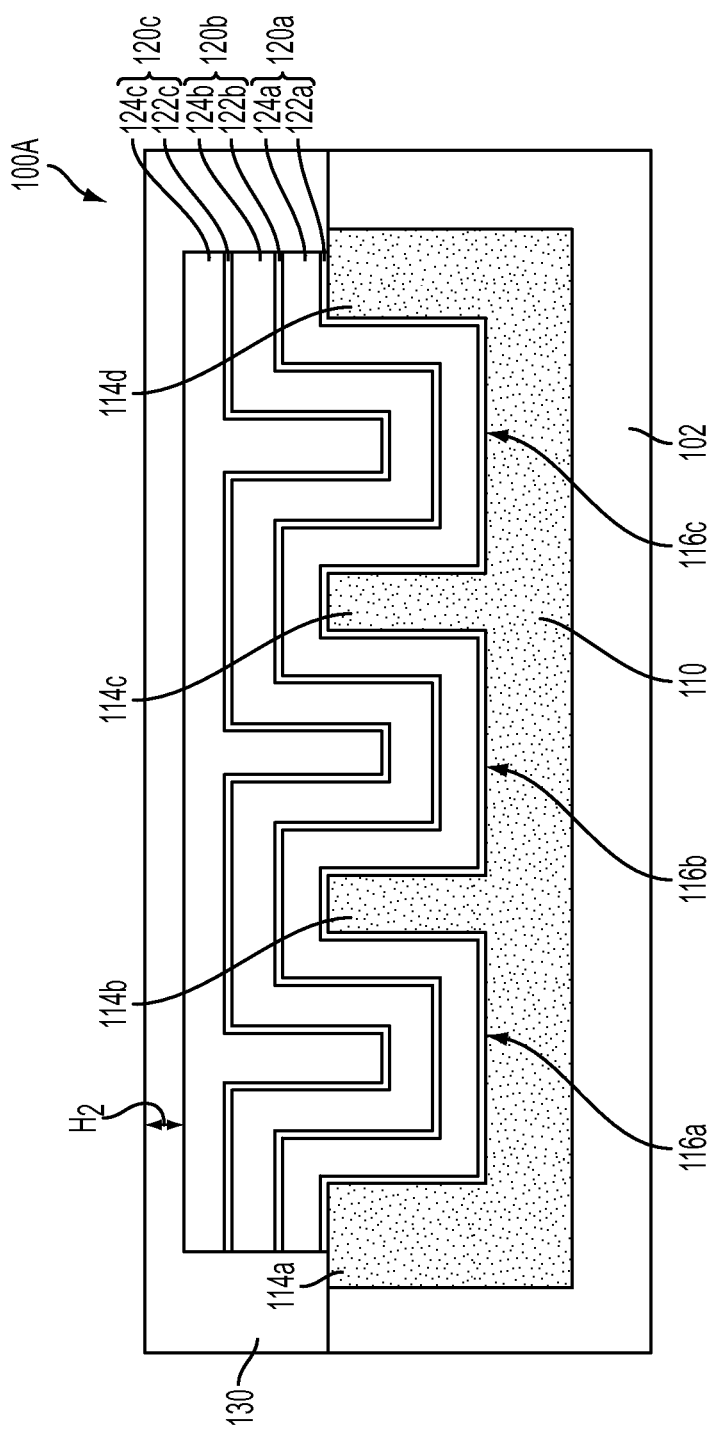

FIG. 4E is a cross-sectional view of a capacitive device 100A following operation 350 in accordance with one or more embodiments. In FIG. 4E, cap dielectric layer 130 over substrate 102 and covers well 110 and stacked layers 120a, 120b, and 120c. An upper surface of cap dielectric layer 130 is higher than an upper surface of the three sets of stacked layers 120a, 120b, and 120c by a height H2. In some embodiments, H2 ranges from 0.3 μm to 1 μm.

Returning to FIG. 3, in operation 360, a plurality of contact holes is formed. The plurality of contact holes variously exposes the well or conductive layers of the N sets of stacked layers. The plurality of contact holes is directly on or above corresponding one or more of the M shoulder portions. In some embodiments, the plurality of contact holes has a contact hole passing though the cap dielectric layer and the N sets of stacked layers and exposing the well at one of the M shoulder portions. The plurality of contact holes also has at least another contact hole exposing a conductive layer of one of the N sets of stacked layers over one of the M shoulder portions.

For example, when N is set to three (3), operation 360 includes operations 362, 364, and 366. In some embodiments, operation 360 includes more or less than three sub-operations.

In operation 362, an etch process configured to etch through a portion of the cap dielectric layer is performed. In some embodiments, operation 362 further includes forming a patterned mask to define positions of the plurality of contact holes prior to performing the etch process. In some embodiments, the etch process performed in operation 362 includes a dry etch process. A plurality of openings corresponding to the plurality of contact holes that has corresponding predetermined depth is formed upon completion of operation 360.

Figure 4F:
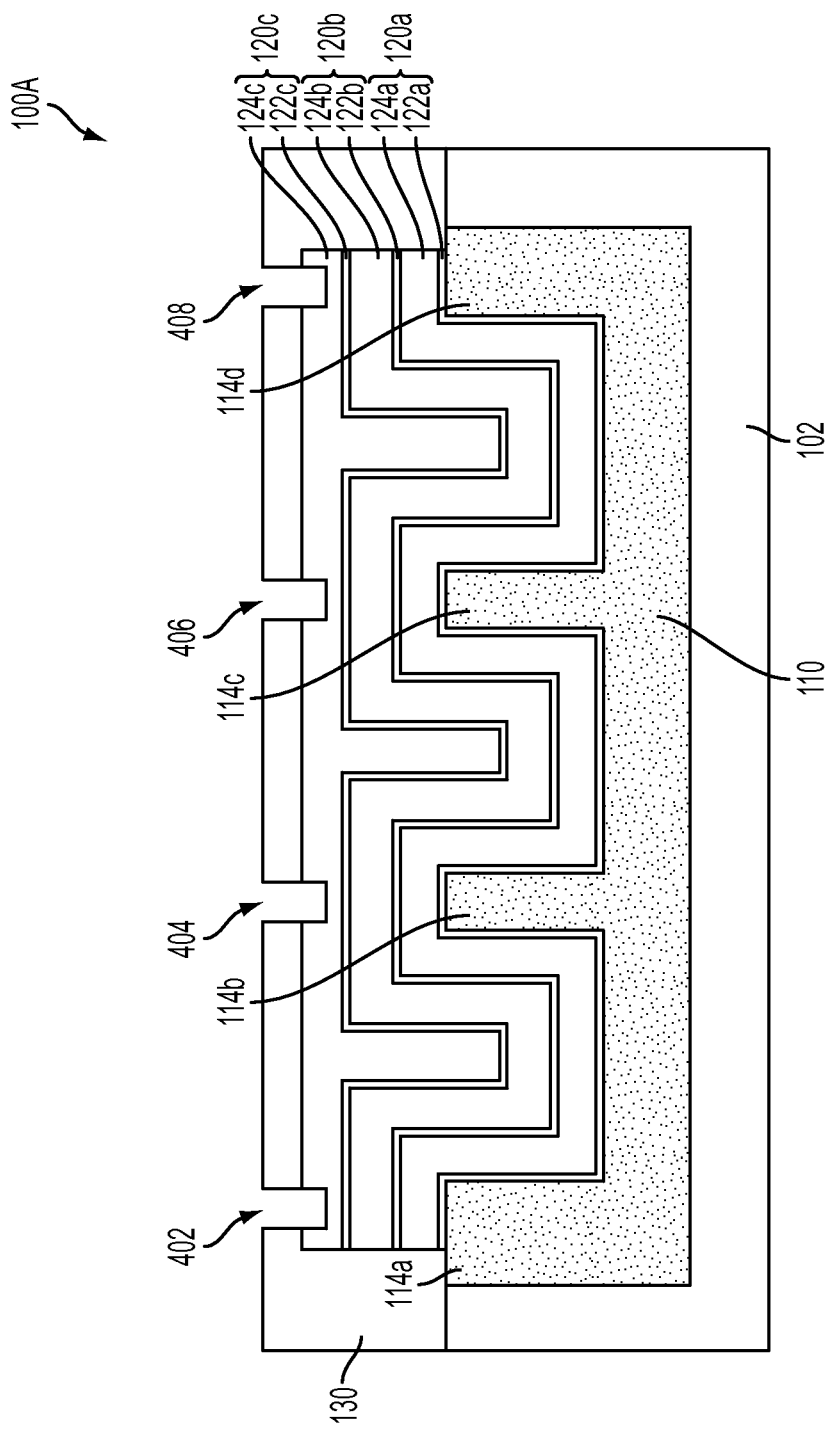

FIG. 4F is a cross-sectional view of a capacitive device 100A following operation 362 in accordance with one or more embodiments. In FIG. 4F, openings 402, 404, 406, and 408 passing through cap dielectric layer 130 are formed. A portion of conductive layer 124c is removed during the etch process (operation 362), but none of the openings 402, 404, 406, and 408 passing through conductive layer 124c upon completion of operation 362. In FIG. 4F, opening 408 is the contact hole for making electrode 142d (FIG. 1A), which is electrically coupled to conductive layer 124c. Therefore, in some embodiments, opening 408 is not further extended downwardly in the following operations.

Returning to FIG. 3, in operation 364, an etch process configured to etch through only two of the N sets of stacked layers is performed. In at least some embodiments, the etch process of operation 364 is set to be capable of penetrating two consecutive sets of stacked layers, which include two conductive layers and two dielectric layers, but is incapable of completely passing through one extra conductive layer. In some embodiments, operation 364 further includes forming a patterned mask to protect one or more openings in the resulting structure after operation 362 that does not need to be extended downwardly for a depth of two sets of stacked layers. Thus, the patterned mask only exposes the other one or more openings in the resulting structure after operation 362 that is suitable to be extended downwardly for the depth of two sets of stacked layers without exceeding their predetermined depths. In some embodiments, the etch process performed in operation 364 includes a dry etch process.

Figure 4G:
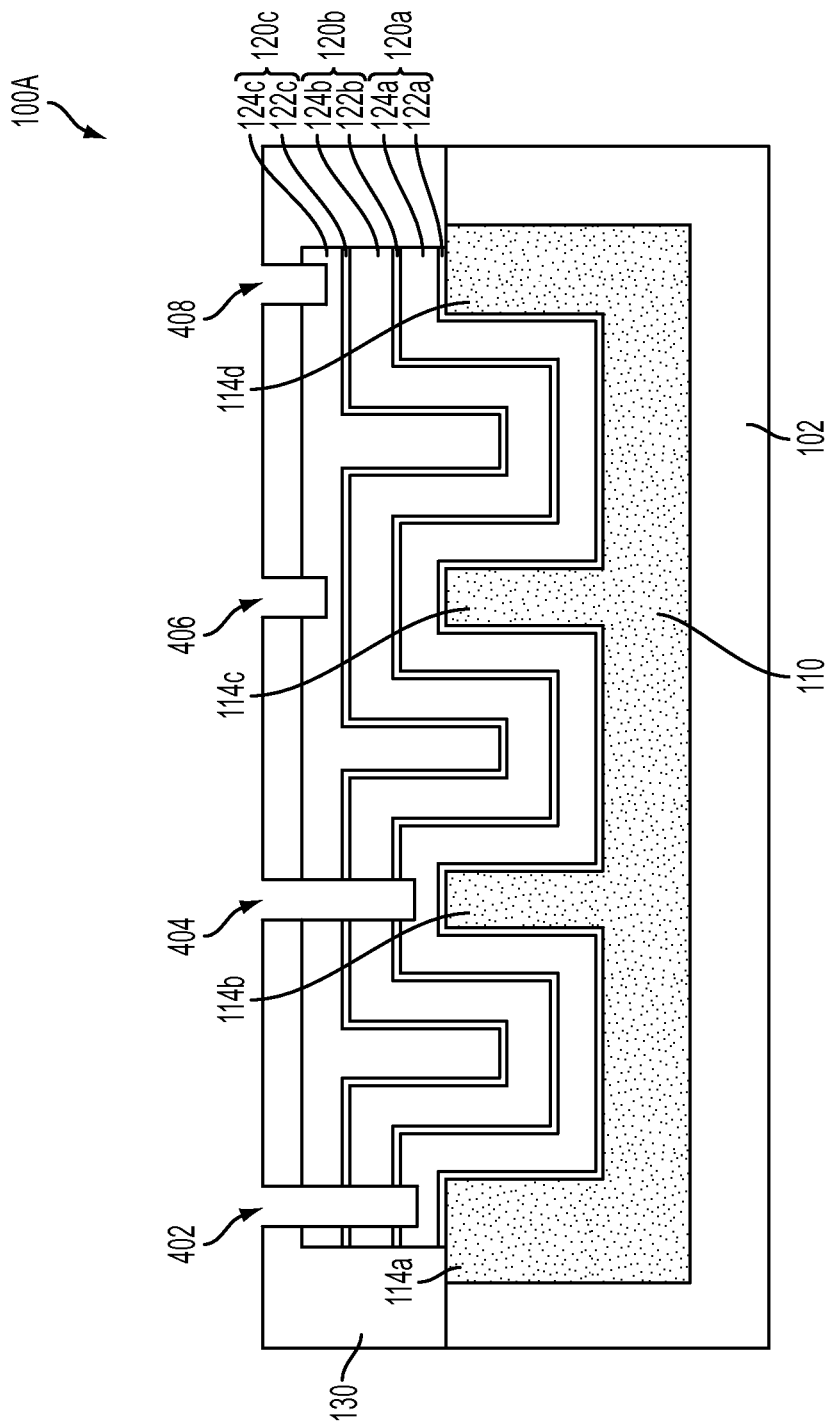

FIG. 4G is a cross-sectional view of a capacitive device 100A following operation 364 in accordance with one or more embodiments. In FIG. 4G, openings 402 and 404 are further extended downwardly to pass through conductive layers 124c and 124b and dielectric layers 122c and 122b. Opening 406 and 408 are protected by the patterned mask and thus are not exposed to the etch process of operation 364. A portion of conductive layer 124a is removed during the etch process (operation 364), but none of the openings 402 and 404 passing through conductive layer 124a upon completion of operation 364. In FIG. 4G, opening 404 is the contact hole for making electrode 142b (FIG. 1A), which is electrically coupled to conductive layer 124a. Therefore, in some embodiments, opening 404 is not further extended downwardly in the following operations.

Returning to FIG. 3, in operation 366, an etch process configured to etch through only one of the N sets of stacked layers is performed. In at least some embodiments, the etch process of operation 366 is set to be capable of penetrating one set of stacked layers, which includes one conductive layer and one dielectric layer, but is incapable of completely passing through one extra conductive layer. In some embodiments, operation 366 further includes forming a patterned mask to protect one or more openings in the resulting structure after operation 364 that does not need to be extended downwardly for a depth of two sets of stacked layers. Thus, the patterned mask only exposes the other one or more openings in the resulting structure after operation 364 that is suitable to be extended downwardly for the depth of one set of stacked layers without exceeding their predetermined depths. In some embodiments, the etch process performed in operation 366 includes a dry etch process.

Figure 4H:
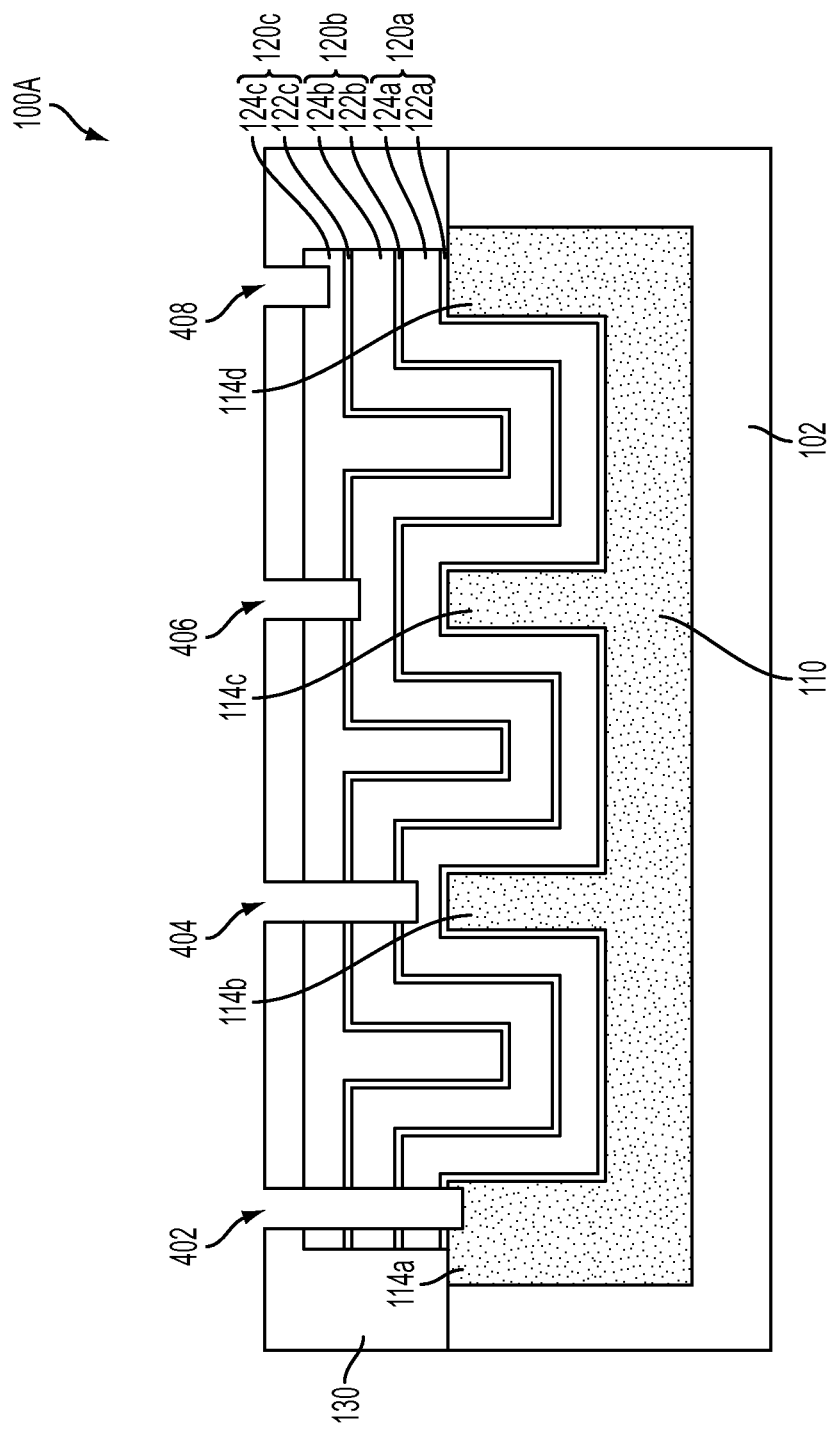

FIG. 4H is a cross-sectional view of a capacitive device 100A following operation 366 in accordance with one or more embodiments. In FIG. 4H, openings 402 and 406 are further extended downwardly to variously pass through conductive layers 124c or 124a and dielectric layers 122c or 122a. Opening 404 and 408 are protected by the patterned mask and thus are not exposed to the etch process of operation 366. For opening 406, a portion of conductive layer 124b is removed during the etch process (operation 366). For opening 402, a portion of well 110 at shoulder portion 114a is removed during the etch process (operation 366). In FIG. 4H, opening 404 is the contact hole for making electrode 142c (FIG. 1A), which is electrically coupled to conductive layer 124b. Also, opening 402 is the contact hole for making electrode 142a (FIG. 1A), which is electrically coupled to well 110.

Returning to FIG. 3, in operation 370, a plurality of isolation structures is formed on sidewalls of the plurality of contact holes. In some embodiments, the isolation structures comprise silicon nitride or silicon oxide. In some embodiments, formation of the plurality of isolation structures includes performing a CVD process, such as an LPCVD process, or a thermal process to form a layer of isolation material lined along the resulting structure of FIG. 4G. In some embodiments, formation of the plurality of isolation structures further includes performing a dry etch to remove a portion of the layer of isolation material and to leave the other portion of the layer of isolation material on sidewalls of the conductive holes.

Figure 4I:
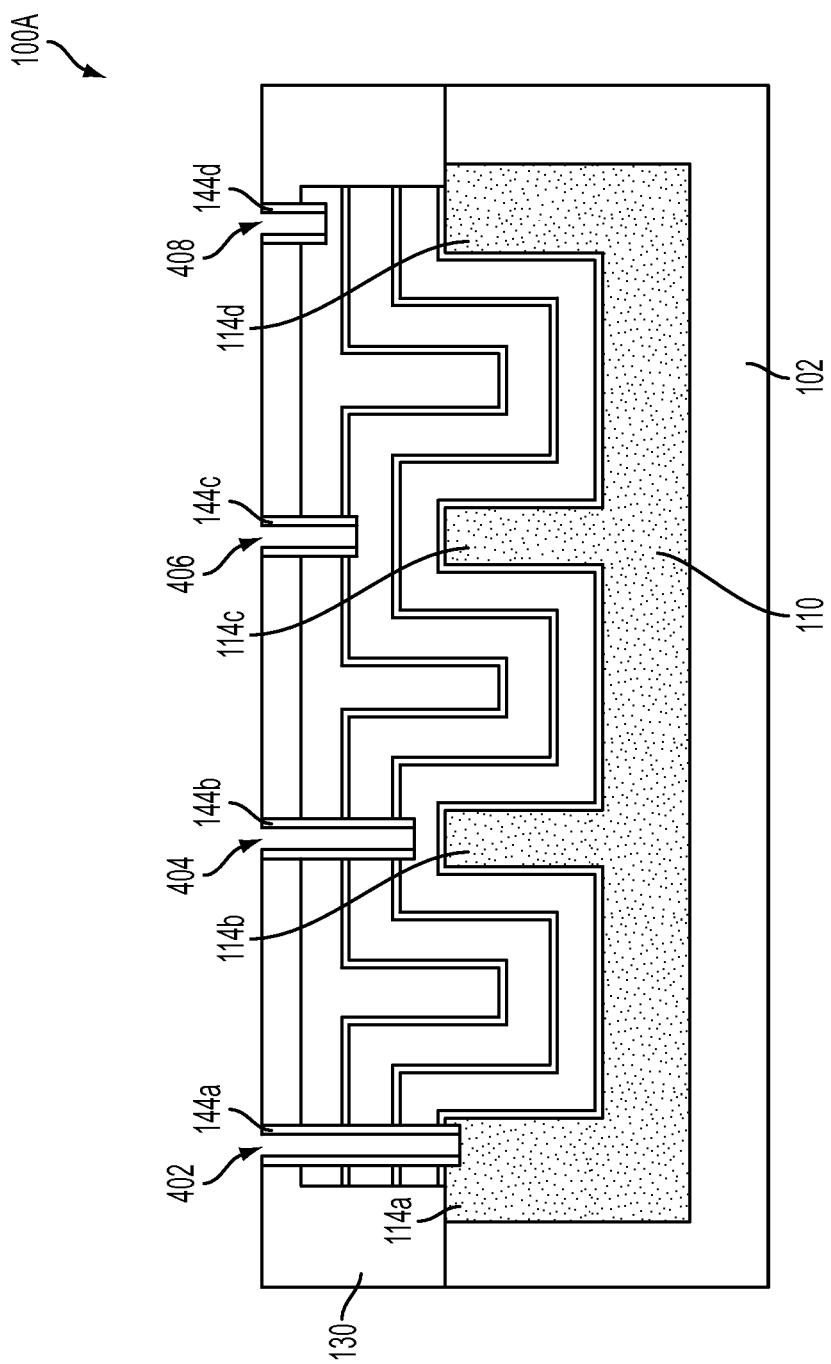

FIG. 4I is a cross-sectional view of a capacitive device 100A following operation 370 in accordance with one or more embodiments. In FIG. 4I, isolation structures 144a-144d are formed on sidewalls of openings 402, 404, 406, and 408.

Returning to FIG. 3, in operation 380, a plurality of electrodes is formed in the plurality of contact holes. In some embodiments, the electrodes comprise aluminum, copper, or tungsten. In some embodiments, at least one of the electrodes has one or more layers of core conductive materials and one or more layers of barrier materials between the one or more layers of core conductive materials and the corresponding isolation structure. In some embodiments, formation of the plurality of electrodes includes performing a CVD process, an electroplating process, or a Damascene processes.

Following operation 380, the capacitive device has a similar structure to capacitive device 100A.

Compared with a configuration and method that have most of the electrodes arranged beyond the end walls, such as end walls 126a and 126b, of the N sets of stacks of layers, capacitive device 100A, 100B, or 200 occupies a smaller chip size, is capable of providing reduced equivalent series resistance (ESR) of conductive layers and the well, is suitable to be manufactured using simplified contact etch processes, and is suitable to have enlarged trenches to offer larger capacitance values.

In accordance with one embodiment, a capacitive device includes a substrate, a well structure buried in the substrate, a first stacked layer that includes a first dielectric layer and a first conductive layer, a cap dielectric layer, and a first electrode. The well has a predetermined doping type. The well includes a first shoulder portion having an upper surface, a second shoulder portion having an upper surface, and a first trench, between the first and second shoulder portions. The first trench has sidewalls and a bottom surface. The first dielectric layer is lined along at least a portion of the upper surfaces of the first and second shoulder portions, the sidewalls of the first trench, and the bottom surface of the first trench. The first conductive layer is lined along the first dielectric layer. The cap dielectric layer is over the well, the first dielectric layer, and the first conductive layer. The first electrode is in contact with the first shoulder portion and extending through the cap dielectric layer, the first conductive layer, and the first dielectric layer.

In accordance with another embodiment, a capacitive device includes a substrate, a well structure, N sets of stacked layers, a cap dielectric layer over the well or the N sets of stacked layers, and a first set of electrodes variously in contact with the well and conductive layers of the N sets of stacked layers. N is a positive integer. The well has a predetermined doping type different from a predetermined doping type of the substrate and is buried in the substrate. The well includes M shoulder portions and (M−1) trenches, and M is a positive integer equal to or greater than 2. Each of the M shoulder portions having an upper surface. An m-th trench of the (M−1) trenches is between an m-th shoulder portion and an (m+1)-th shoulder portion of the M shoulder portions. The m-th trench of the (M−1) trenches has sidewalls and a bottom surface, m is a positive integer from 1 to (M−1). The N sets of stacked layers are lined along the upper surfaces of the M shoulder portions, the sidewalls of the (M−1) trenches, and the bottom surfaces of the (M−1) trenches. Each set of the N sets of stacked layers includes a dielectric layer and a conductive layer over the dielectric layer. The first set of electrodes are aligned along a trench width direction and directly on or above a first one of the M shoulder portions.

In accordance with another embodiment, a capacitor includes a substrate and a well structure buried in the substrate. The substrate is an intrinsic semiconductor material or a P-doped semiconductor material. The well structure is N-doped. The well structure includes M shoulder portions and (M−1) trenches where an m-th trench of the (M−1) trenches is between an m-th shoulder portion and an (m+1)-th shoulder portion of the M shoulder portions. M is a positive integer equal to or greater than 2, and m is a positive integer from 1 to (M−1). N sets of stacked layers are lined along upper surfaces of the M shoulder portions, sidewalls of the (M−1) trenches, and bottom surfaces of the (M−1) trenches are formed. Each set of the N sets of stacked layers includes a dielectric layer and a conductive layer over the dielectric layer. N is a positive integer equal to or greater than 1. A cap dielectric layer overlies the well and the N sets of stacked layers. A plurality of contact holes that variously expose the well or conductive layers of the N sets of stacked layers, where each hole of the plurality of contact holes is directly on or above one or more of the M shoulder portions. The plurality of contact holes include a first contact hole that exposes the well at a first shoulder portion of the set of M shoulder portions, the first contact hole passing though the cap dielectric layer and the N sets of stacked layers. A plurality of electrodes, where each electrode of the plurality of electrodes is in one contact hole of the plurality of contact holes are also included.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitive device, comprising:
   a substrate having a well structure buried therein, the well structure having a first predetermined doping type, the well comprising:
   a first shoulder portion and a second shoulder portion, each having an upper surface;
   a first trench, between the first and second shoulder portions, the first trench having sidewalls defining a trench width and a bottom surface defining a trench depth; and
   a first stacked layer comprising a first dielectric layer on at least a portion of the upper surfaces of the first and second shoulder portions, the sidewalls and the bottom surface of the first trench, and a first conductive layer on the first dielectric layer;
   a cap dielectric layer over the well and the first stacked layer; and
   a first electrode in direct contact with the first shoulder portion wherein the first electrode extends through the cap dielectric layer and the first stacked layer.

2. The capacitive device of claim 1, further comprising an isolation structure surrounding a portion of the first electrode, wherein the isolation structure electrically isolates the first electrode and the first conductive layer.

3. The capacitive device of claim 1, wherein the substrate comprises a semiconductor material selected from the group consisting of silicon or germanium in crystal, polycrystalline, or an amorphous structure; a compound semiconductor including silicon carbide, gallium arsenide, gallium phosphide, gallium nitride, indium phosphide, indium arsenide, indium antimonide; an alloy semiconductor including SiGe, GaAsP, AlInAs, AlGaAs, GaInAs, GaInP, GaInAsP and combinations thereof.

4. The capacitive device of claim 1, wherein the substrate is silicon, germanium or a compound semiconductor material.

5. The capacitive device of claim 1, wherein the substrate exhibits a conductive characteristic of an intrinsic semiconductor material or a second predetermined doping type different from the first predetermined doping type.

6. The capacitive device of claim 5, wherein the first predetermined doping type is a N-type doping and the second predetermined doping type is a P-type doping.

7. The capacitive device of claim 1, further comprising:
   a second stacked layer comprising a second dielectric layer and a second conductive layer, the second stacked layer on the first stacked layer; and
   a second electrode in contact with the second conductive layer and extending through the cap dielectric layer, the second electrode being directly above one of the first shoulder portion or the second shoulder portion.

8. The capacitive device of claim 7, wherein the second electrode is directly above the first shoulder portion, the first and second electrodes being aligned along the width of the trench.

9. The capacitive device of claim 7, further comprising:
   a third electrode in direct contact with the first conductive layer and extending through the cap dielectric layer, the second electrode being directly above the first shoulder portion, the first, second, and third electrodes being aligned along the width of the trench.

10. The capacitive device of claim 7, wherein a distance between the first and second electrodes is less than a distance between the first and the third electrodes and less than a distance between the second and the third electrodes.

11. The capacitive device of claim 1, wherein
the well further comprises:
- a third shoulder portion having an upper surface; and
- a second trench, between the second and third shoulder portions, having sidewalls defining a width of the second trench and a bottom surface defining a depth of the second trench;
the first dielectric layer lined along the upper surface of the third shoulder portion, the sidewalls of the second trench, and the bottom surface of the second trench; and
the capacitive device further comprises:
- a second electrode in contact with the first conductive layer and extending through the cap dielectric layer, the second conductive layer being directly above the first shoulder portion, directly above the second shoulder portion, or directly above the third shoulder portion.

12. The capacitive device of claim 11, wherein the first shoulder portion, the second shoulder portion or the third shoulder portion has a size sufficient to accommodate the first electrode.

13. A capacitive device, comprising:
a substrate having a well structure buried therein, the well structure having a first predetermined doping type different from a second predetermined doping type of the substrate, the well comprising:
- M shoulder portions, M being a positive integer equal to or greater than 2, each shoulder portion of the M shoulder portions having an upper surface;
- (M−1) trenches, an m-th trench of the (M−1) trenches being between an m-th shoulder portion and an (m+1)-th shoulder portion of the M shoulder portions, and the m-th trench of the (M−1) trenches having sidewalls and a bottom surface, m being a positive integer from 1 to (M−1); and
- N sets of stacked layers lined along the upper surfaces of the M shoulder portions, the sidewalls of the (M−1) trenches, and the bottom surfaces of the (M−1) trenches, each set of the N sets of stacked layers comprising a dielectric layer and a conductive layer over the dielectric layer, N being a positive integer;
a cap dielectric layer over the well and the N sets of stacked layers; and
a first set of electrodes, at least one electrode of the first set of electrodes being variously in direct contact with the well, one or more other electrodes of the first set of electrodes being in direct contact with various conductive layers of the N sets of stacked layers, the first set of electrodes being aligned along a trench width direction and directly on or above a first one of the M shoulder portions.

14. The capacitive device of claim 13, wherein
the conductive layers of the N sets of stacked layers each having a thickness equal to or greater than $T_a$;
the dielectric layers of the N sets of stacked layers each having a thickness equal to or greater than $T_b$; and
the (M−1) trenches each having a width equal to or greater than $(2 \cdot N \cdot (T_a + T_b) - T_b)$.

15. The capacitive device of claim 13, wherein
the well and the conductive layers of each set of the N sets of stacked layers are configured to function as a capacitor having a first terminal and a second terminal;
the first set of electrodes comprise:
- a first sub set of electrodes electrically coupled to the well or the conductive layer of a set of the N sets of stacked layers associated with the first terminal; and
- a second sub set of electrodes electrically coupled to the well or the conductive layer of a set of the N sets of stacked layers associated with the second terminal.

16. The capacitive device of claim 13, further comprising:
a second set of electrodes variously in contact with the well or conductive layers of the N sets of stacked layers, the second set of electrodes being aligned along the trench width direction and directly on or above a second shoulder portion of the M shoulder portions,
the second set of electrodes comprising:
- a third sub set of electrodes electrically coupled to the well or the conductive layers of the N sets of stacked layers associated with the first terminal, the first sub set of electrode and the third sub set of electrodes being aligned along a trench width direction; and
- a fourth sub set of electrodes electrically coupled to the well or the conductive layers of the N sets of stacked layers associated with the second terminal, the second sub set of electrode and the fourth sub set of electrodes being aligned along the trench width direction.

17. A capacitor, comprising:
a substrate having a well structure buried therein, the substrate being an intrinsic semiconductor material or doped with a P doping type, the well structure being doped with a N doping type, the well comprising:
- a set of M shoulder portions and a set of (M−1) trenches, wherein each trench of set of (M−1) trenches is between a first and a second shoulder portion of the set of M shoulder portions, where M is a positive integer equal to or greater than 1; and
- a set of N stacked layers on upper surfaces of each shoulder portion of the set of M shoulder portions, and on sidewalls and bottom surfaces of each trench of the set of (M−1) trenches, each stacked layer of the set of N stacked layers comprising a conductive layer over a dielectric layer, where N is a positive integer equal to or greater than 1;
a cap dielectric layer over the well and the N sets of stacked layers;
a plurality of contact holes configured to variously expose the well or conductive layers of the N sets of stacked layers, each hole of the plurality of contact holes being directly on or above one or more of the M shoulder portions, the plurality of contact holes comprising a first contact hole configured to expose the well at a first shoulder portion of the set of M shoulder portions, wherein the first contact hole passes though the cap dielectric layer and then the N sets of stacked layers;
a plurality of electrodes, each electrode of the plurality of electrodes being in one contact hole of the plurality of contact holes.

18. The capacitor of claim 17, further comprising:
a plurality of isolation structures on sidewalls of each contact hole of the plurality of contact holes.

19. The capacitor of claim 17, wherein each contact hole of the plurality of contact holes is disposed directly above one shoulder portion of the M shoulder portions and penetrates a first dielectric layer of the N sets of stacked layers.

20. The capacitor of claim 17, comprising:
a first contact hole of the plurality of contact holes, wherein the first contact hole passes through the cap dielectric layer and a first stacked layer of the N sets of stacked layers; and
a second contact hole of the plurality of contact holes, wherein the second contact hole passes through the cap dielectric layer, the first stacked layer of the N sets of stacked layers and a second stacked layer of the N sets of stacked layers.

\* \* \* \* \*